(12) United States Patent
Sakai et al.

(10) Patent No.: US 9,238,876 B2
(45) Date of Patent: Jan. 19, 2016

(54) METHOD OF WASHING POLYCRYSTALLINE SILICON, APPARATUS FOR WASHING POLYCRYSTALLINE SILICON, AND METHOD OF PRODUCING POLYCRYSTALLINE SILICON

(75) Inventors: Kazuhiro Sakai, Yokkaichi (JP); Tetsuya Atsumi, Suzuka (JP); Yukiyasu Miyata, Yokkaichi (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 406 days.

(21) Appl. No.: 13/141,802

(22) PCT Filed: Dec. 25, 2009

(86) PCT No.: PCT/JP2009/007311
§ 371 (c)(1),
(2), (4) Date: Jun. 23, 2011

(87) PCT Pub. No.: WO2010/073725
PCT Pub. Date: Jul. 1, 2010

(65) Prior Publication Data
US 2011/0253177 A1 Oct. 20, 2011

(30) Foreign Application Priority Data
Dec. 26, 2008 (JP) .................................. 2008-332320

(51) Int. Cl.
*B08B 3/00* (2006.01)
*B08B 7/04* (2006.01)
(Continued)

(52) U.S. Cl.
CPC ............... *C30B 29/06* (2013.01); *C01B 33/035* (2013.01); *C01B 33/037* (2013.01)

(58) Field of Classification Search
CPC ........ C01B 33/02; C01B 33/037; C30B 29/06
USPC ................................... 134/2, 3, 18, 26, 28, 34
See application file for complete search history.

(56) References Cited

U.S. PATENT DOCUMENTS 3,031,363 A * 4/1962 Soper ........................... 438/747
4,997,490 A 3/1991 Vetter et al.
(Continued)

FOREIGN PATENT DOCUMENTS

CN 1947869 A 4/2007
EP 2039654 A2 3/2009
(Continued)

OTHER PUBLICATIONS

International Search Report dated Apr. 6, 2010, issued for PCT/JP2009/007311.
(Continued)

*Primary Examiner* — Alexander Markoff
(74) *Attorney, Agent, or Firm* — Locke Lord LLP

(57) ABSTRACT

A method of washing polycrystalline silicon is provided. The method includes a step of acid cleaning in which the polycrystalline silicon is cleaned with an acid solution and a step of a water cleaning in which the polycrystalline silicon is cleaned by pure water after the step of acid cleaning. In the step of water cleaning, residual acid solution on the surface of the polycrystalline silicon is removed by immersing the polycrystalline silicon in pure water held in a water cleaning bath, and replacing the pure water in the water cleaning bath at least once. The electrical conductivity (C) of the pure water in the water cleaning bath is measured. Based on the reading of the electrical conductivity (C), the timing for finishing the step of water cleaning is decided.

2 Claims, 6 Drawing Sheets

(51) Int. Cl.
*C30B 29/06* (2006.01)
*C01B 33/037* (2006.01)
*C01B 33/035* (2006.01)

(56) References Cited

U.S. PATENT DOCUMENTS

| | | | |
|---|---|---|---|
| 5,820,688 A * | 10/1998 | Koppl et al. | 134/2 |
| 5,922,138 A * | 7/1999 | Shindo et al. | 134/2 |
| 2001/0015215 A1 | 8/2001 | Massicot et al. | |
| 2005/0081886 A1 | 4/2005 | Miyazaki et al. | |
| 2006/0042539 A1 | 3/2006 | Ohta | |
| 2009/0060824 A1 * | 3/2009 | Sakai | 423/349 |
| 2010/0132746 A1 * | 6/2010 | Sakai et al. | 134/28 |

FOREIGN PATENT DOCUMENTS

| | | |
|---|---|---|
| JP | 06-291100 | 10/1994 |
| JP | 07-022366 | 1/1995 |
| JP | 07187900 A * | 7/1995 |
| JP | 08-164304 A | 6/1996 |
| JP | 2000-302594 A | 10/2000 |
| JP | 2002-289575 A | 10/2002 |
| JP | 2002-293688 A | 10/2002 |
| JP | 2003-128492 A | 5/2003 |
| JP | 2005-288333 A | 10/2005 |
| JP | 2008-143774 A | 6/2008 |
| JP | 2008-303142 A | 12/2008 |

OTHER PUBLICATIONS

Office Action issued Nov. 19, 2012, issued for the Korean patent application No. 10-2011-7010149 and English translation thereof.
Notice of Reasons for Rejection, issued in corresponding Japanese Patent Application No. JP2009-294867, issued Jun. 25, 2013.
European Search Report mailed Apr. 20, 2015, issued for the European patent application No. 09834531.7.

* cited by examiner

METHOD OF WASHING POLYCRYSTALLINE SILICON, APPARATUS FOR WASHING POLYCRYSTALLINE SILICON, AND METHOD OF PRODUCING POLYCRYSTALLINE SILICON

BACKGROUND OF THE INVENTION

Priority is claimed on Japanese Patent Application No. 2008-332320, filed Dec. 26, 2008, the contents of which are incorporated herein by reference.

FIELD OF THE INVENTION

The present invention relates to a method of washing polycrystalline silicon used, for example, as a raw material for semiconductor silicon, an apparatus for washing polycrystalline silicon which is suitable for carrying out the method of washing, and a method of producing polycrystalline silicon using the method of washing.

DESCRIPTION OF THE RELATED ART

As a raw material of a single crystalline silicon wafer for a semiconductor, for example, extremely high-purity polycrystalline silicon having a purity of 99.999999999% or higher is used. This polycrystalline silicon is produced by the so-called Siemens method in which trichlorosilane ($SiHCl_3$) gas and hydrogen gas are supplied into a reacting furnace in which silicon seed rods are placed, to deposit high-purity polycrystalline silicon on the silicon seed rods. Substantially columnar polycrystalline silicon ingots having a diameter of about 140 mm are obtained in this manner. This polycrystalline silicon ingot is subjected to processing such as cutting and crushing or the like to obtain lump polycrystalline silicon. This lump polycrystalline silicon is classified by the size.

On the surface of the polycrystalline silicon ingot and the lump polycrystalline silicon, contaminants are adhered or oxide films are formed. If the contaminants or the oxide films are incorporated into a production process of single crystalline silicon, quality of the single crystalline silicon is significantly deteriorated. Therefore, there is a need to improve cleanliness by washing the polycrystalline silicon.

In the situation described above, for example, methods for washing the surface of polycrystalline silicon ingots and lump polycrystalline silicon have been proposed in Japanese Unexamined Patent Application, First Publication Nos. 2000-302594 and 2002-293688. The methods includes an acid cleaning step using an acid solution and a subsequent water cleaning step using pure water.

As an acid solution used in the acid cleaning step, a mixed solution of hydrofluoric acid and nitric acid is used. By immersing the polycrystalline silicon in the acid solution, the surface of polycrystalline silicon is dissolved, thereby the contaminants and oxide films are removed. Thereafter, the polycrystalline silicon is washed with pure water to remove residual acid solution on the surface of polycrystalline silicon.

In addition, another method for washing silicon materials is described in Chinese Patent Application, Publication No. 1947869. The method includes: (1) a step of acid immersing in which the silicon materials are immersed in a mixed solution of hydrofluoric acid and nitric acid, (2) a step of cleaning in which the silicon materials are retrieved from the mixed acid solution after the step of immersing, and cleaned with pure water several times, (3) a step of pure water immersing in which the silicon materials are immersed in pure water after the step of cleaning, (4) a step of measuring in which conductivity of the pure water in the step of the pure water immersing is measured, and (5) a step of drying in which the silicon materials are dried after retrieval from the pure water. Immersing time in pure water ranges from 10 to 30 minutes. The pure water is gas agitated with babbling made by compressed air. For measuring conductivity, a portable conductivity meter is used. The silicon materials are retrieved from the pure water when conductivity of the pure water is 1.3 μS/cm or lower, and dried (see page 5, lines 4 to 9 of Chinese Patent Application, Publication No. 1947869).

In the above-mentioned water cleaning step, it is required to remove residual acid solution on the surface of polycrystalline silicon completely. A washing method such as spraying pure water cannot remove the acid solution trapped in asperity of the polycrystalline silicon surface. For this reason, it is necessary to immerse the polycrystalline silicon for a long time in an immersing bath in which pure water is stored. Here, the pure water is gradually contaminated by acid solution eluted into the pure water. Therefore, pure water is replaced at least once to improve the cleanliness of the polycrystalline silicon.

As a method for evaluating extent of removal of the acid solution from the surface of the polycrystalline silicon, a method relying on measurement of the pH, or an ion concentration of pure water can be applied. However, in the measurement of the pH or the ion concentration, analytical accuracy at extremely low concentration range, such as a nitric acid concentration of 0.1 mg/L or less, is not adequate. Thus, it is impossible to evaluate the extent of removal of the acid solution with high precision. In addition, since the measurement of ion concentration takes time, it is not easy to evaluate the extent of removal of the acid solution. Further, accurate measurement of the pH and an ion concentration is difficult due to interference of carbon dioxide in the air.

In Chinese Patent Application, Publication No. 1947869, conductivity of pure water is measured with a portable conductivity meter. Handling of the portable conductivity meter is laborious, and measurement with the portable conductivity meter is prone to output an erratic pattern. Therefore, it is difficult to determine the appropriate timing precisely to finish the pure water cleaning, based on the measurement with the portable conductivity meter.

The present invention has been made under the circumstances described above. One of the objects of the present invention is to provide a method of washing polycrystalline silicon allowing the appropriate timing to finish the pure water cleaning to be found easily and precisely. Another object of the present invention is to provide an apparatus of washing polycrystalline silicon using the method of washing above. Another object of the present invention is to provide a method of producing high quality polycrystalline silicon using the method of washing above.

SUMMARY OF THE INVENTION

The first aspect of the present invention is a method of washing polycrystalline silicon. The method includes a step of acid cleaning in which the polycrystalline silicon is cleaned with an acid solution; and a step of water cleaning in which the polycrystalline silicon is cleaned with pure water after the step of acid cleaning, wherein, residual of the acid solution on a surface of the polycrystalline silicon is removed by immersing the polycrystalline silicon in pure water held in a water cleaning bath, and replacing the pure water in the water cleaning bath at least once, in the step of water cleaning; an electrical conductivity C of the pure water in the water cleaning bath is measured after allowing the polycrystalline silicon to stand and remain immersed in the replaced pure water for at least 2 hours; and the step of the water cleaning is finished after the electrical conductivity C of the pure water becomes 2 μS/cm or lower.

According to the above-mentioned method of washing polycrystalline silicon, it is possible to remove a residual acid solution on the surface of polycrystalline silicon effectively by replacing pure water in the water cleaning bath where polycrystalline silicon is immersed after the step of acid cleaning, at least once with fresh pure water. In addition, by measuring the electrical conductivity of this pure water, it is possible to estimate the acid concentration in the pure water, to evaluate the extent of removal of the acid solution from the acid concentration, and to find the appropriate timing to finish the step of water cleaning. Besides, the electrical conductivity can be measured in a short time. Even if the acid concentration is as extremely low as 0.1 mg/L or less, the electrical conductivity can be measured accurately.

In the method of washing polycrystalline silicon configured as above, the step of water cleaning is finished when the electrical conductivity becomes 2 μS/cm or less.

Thus, it is possible to accurately determine the concentration of acid even if it is lower than a level that cannot be measured in the conventional methods of measuring pH or ion concentration. Consequently, cleanliness of polycrystalline silicon can be surely improved.

In this configuration, the electrical conductivity of the pure water in the water cleaning bath is low just after the replacement of the pure water, and longer the water cleaning time, the electrical conductivity value shifts higher. Thus, the electrical conductivity is measured at least after 2 hours, after the replacement of the pure water. If the electrical conductivity after 2 hours of immersing the polycrystalline silicon in the replaced pure water reaches a value indicating sufficient cleanliness (2 μS/cm) or lower, the step of water cleaning is finished.

In the first aspect of the present invention, pure water can be overflowed for a predetermined period by supplying pure water to the water cleaning bath, after replacing the pure water in the water cleaning bath.

After the replacement of the pure water, chipped fragments or the like in a bucket holding the polycrystalline silicon can be suspended (floated). Thus, by overflowing the pure water for a predetermined period, and discharging the fragments, the cleanliness of the pure water improves and as a result washing efficiency is also improved.

The second aspect of the present invention is an apparatus for washing the polycrystalline silicon. The apparatus includes, a water cleaning bath for immersing the polycrystalline silicon in pure water after a step of acid cleaning with an acid solution; a water drainage device that drains pure water in the water cleaning bath; a pure water supplying device that supplies fresh pure water to the water cleaning bath; and an electrical conductivity measuring device that measures an electrical conductivity of the pure water held in the water cleaning bath.

According to the above-mentioned apparatus for washing polycrystalline silicon, since the water cleaning bath includes the water drainage device and a pure water supplying device, pure water in the water cleaning bath, in which the polycrystalline silicon after the step of acid cleaning is immersed, can be replaced with fresh pure water. Because of this, the residual acid solution on the surface of polycrystalline silicon can be effectively removed. Furthermore, since the apparatus for washing includes the electrical conductivity measuring device, it is possible to evaluate the extent of removal of the acid solution based on a change of the electrical conductivity, and to find an appropriate timing to finish the step of water cleaning.

In the second aspect of the present invention, the apparatus for washing polycrystalline silicon further comprises an overflow flow channel in the water cleaning bath.

By having the overflow flow channel, it is possible to clean the polycrystalline silicon during overflowing the pure water, after immersing the polycrystalline silicon in the water cleaning bath.

In the second aspect of the present invention, a sensing element of the electrical conductivity measuring device is placed in a vicinity of a feed-water inlet of the pure water supplying device provided at a location distant from a drain outlet of the water drainage device.

By providing the sensing element adjacent to the feed-water inlet provided at a location distant from the drain outlet, adherence of acid eluted to the pure water to the sensing element is prevented. As a result, the electrical conductivity can be measured accurately.

The third aspect of the present invention is a method of producing polycrystalline silicon. The method includes: a step of silicon depositing in which polycrystalline silicon is deposited by reacting raw material gas containing chlorosilane gas and hydrogen gas; and a step of cleaning in which the deposited polycrystalline silicon is cleaned, wherein, the step of cleaning is carried out by the method of the first aspect of the present invention.

According to the above-mentioned method of producing polycrystalline silicon, contaminants can be removed from the surface of the deposited polycrystalline silicon, and can also obtain high-quality polycrystalline silicon with no residual acid used for removal of the contaminants.

The present invention provides a method of washing polycrystalline silicon and an apparatus for washing polycrystalline silicon, in which completion of acid solution removal can be easily and accuracy determined, in the step of water cleaning after a step of acid cleaning with an acid solution. In addition, by washing the deposited polycrystalline silicon by the method of washing polycrystalline silicon, it is possible to provide high quality polycrystalline silicon.

DETAILED DESCRIPTION OF THE INVENTION

A method of washing polycrystalline silicon, an apparatus for washing polycrystalline silicon, and a method of producing polycrystalline silicon as embodiments of the present invention will be described with reference to the drawings.

Figure 1:
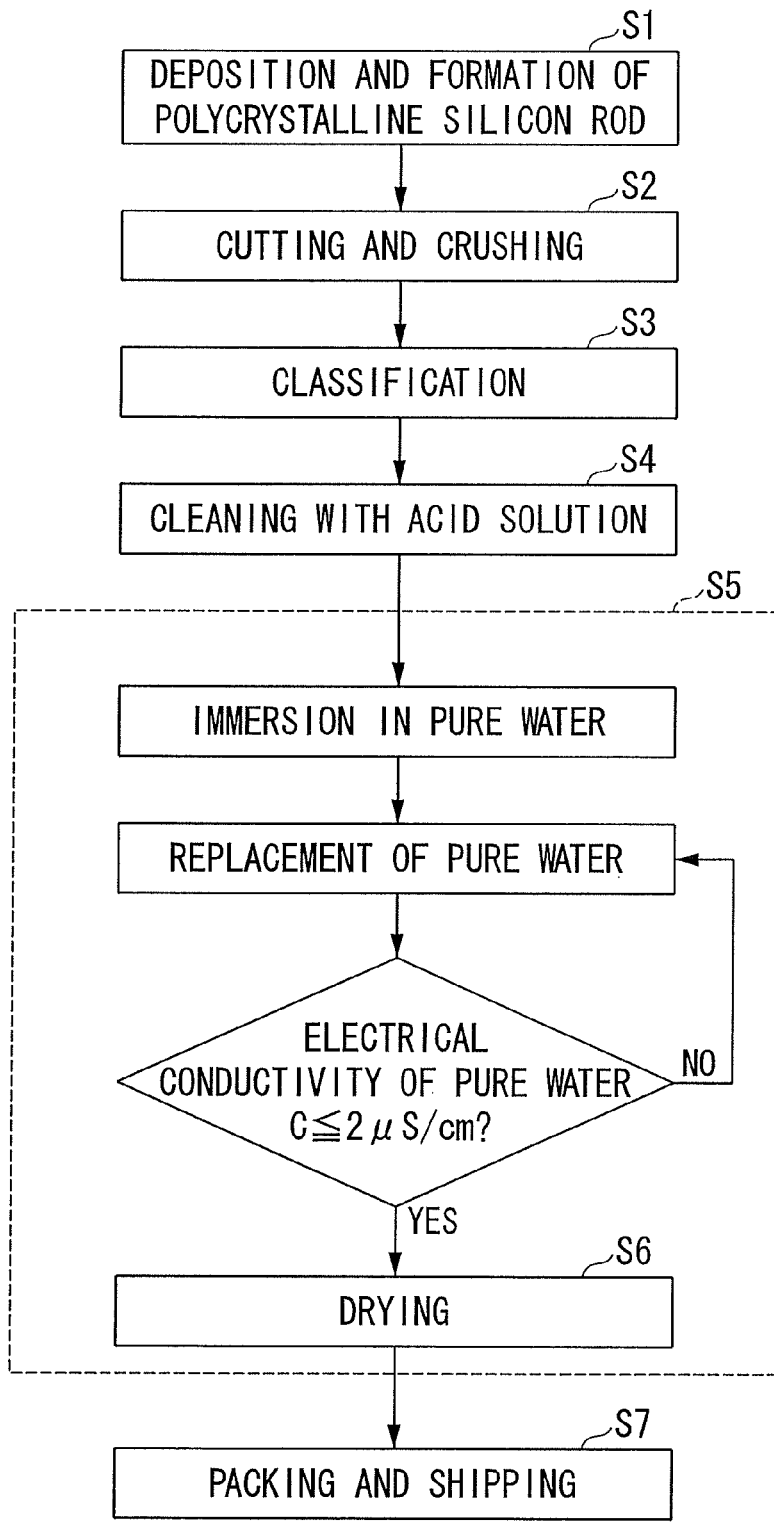
FIG. 1 is a flow chart showing a method of producing polycrystalline silicon which includes a method of washing polycrystalline silicon of an embodiment of the present invention.

In the method of producing polycrystalline silicon according to a present embodiment, a polycrystalline silicon is deposited by the Siemens method to form an ingot, the ingot is cut and crushed, and a surface of the obtained lump polycrystalline silicon is washed. A flow chart of the method of producing polycrystalline silicon which includes the method of washing polycrystalline silicon as the present embodiment is indicated in FIG. 1.

(Polycrystalline Silicon Depositing Step S1)

Figure 6:
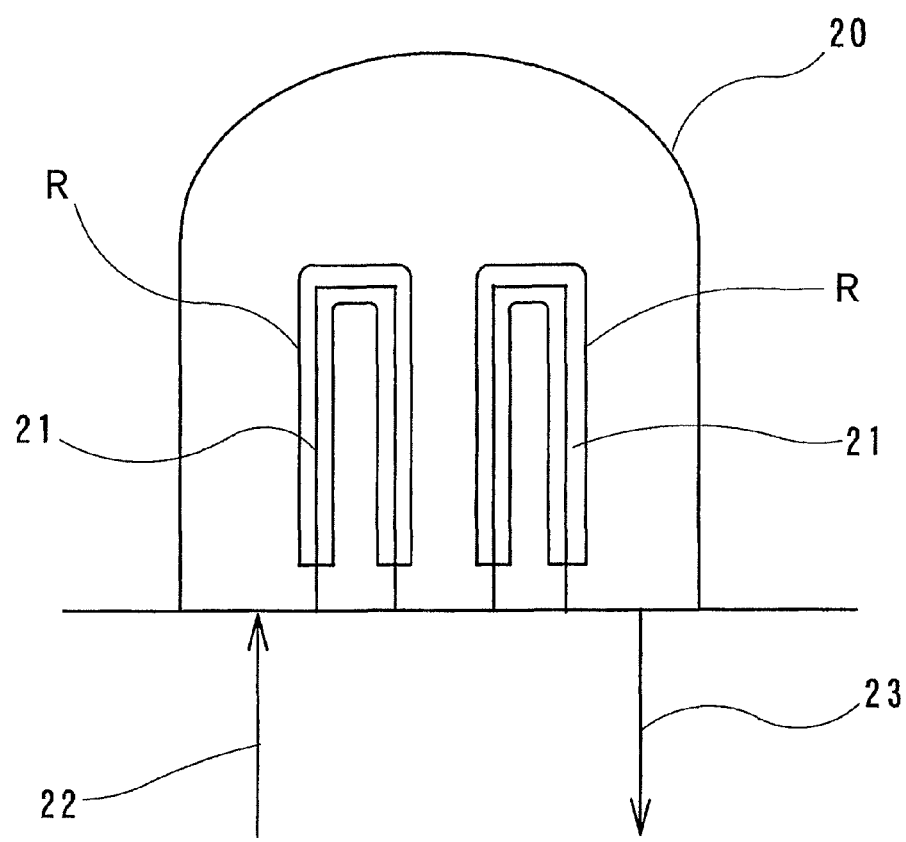
FIG. 6 is a schematic cross-sectional diagram showing a reacting furnace in a silicon depositing step in producing polycrystalline silicon.

A polycrystalline silicon ingot is produced by the Siemens method. In more detail, a plurality of silicon seed rods 21 is set up in a reacting furnace 20 as shown in FIG. 6. Into this reacting furnace 20, a raw material gas containing trichlorosilane gas and hydrogen gas is supplied through a raw material gas supply pipe 22. By applying electricity to the silicon seed rods 21, trichlorosilane and hydrogen react, depositing high-purity silicon on a surface of the silicon seed rods 21 and generating hydrochloric acid gas and the like. By continuing this reaction, substantially columnar polycrystalline silicon ingots R with a diameter of about 140 mm, can be obtained. Gas in the reacting furnace 20 is discharged from a gas discharge pipe 23 to the outside.

(Cutting and Crushing Step S2)

Figure 7:
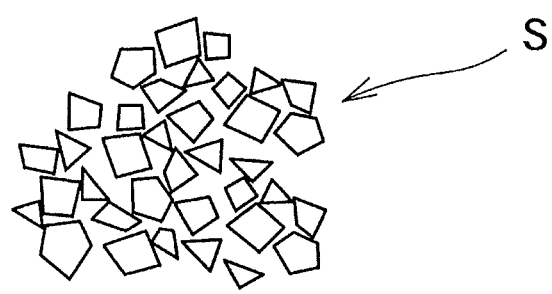
FIG. 7 is a front view of a polycrystalline silicon rod crushed into lumps after retrieval from the reacting furnace.

The substantially columnar ingot R, which is obtained as described above, is cut and crushed into a size to charge into a crucible for single crystalline silicon production. In the present embodiment, the ingot R is quenched after heating to form cracks. After that, the ingot R is crushed with a hammer to obtain lumps of polycrystalline silicon S, called chunks as shown in FIG. 7.

(Classification Step S3)

In the above-described cutting and crushing step, lumps of polycrystalline silicon with various sizes are produced. These lumps of polycrystalline silicon are classified by their sizes.

In the cutting and crushing step and the classification step of a polycrystalline silicon ingot, contaminants such as dust adhere to or oxide films are formed on the surface of the lumps of polycrystalline silicon. If polycrystalline silicon, which has contaminants adhered to the surface of the polycrystalline silicon or the oxide films formed thereon, is used as materials for single crystalline silicon production, it is possible that the contaminants or the like are incorporated to the single crystalline silicon. Since such contamination deteriorate the quality of the single crystalline silicon, they cannot be used as a raw material of single crystalline silicon. Therefore, polycrystalline silicon is washed as described below.

(Acid Cleaning Step S4)

First of all, by immersing the polycrystalline silicon S retained in a basket B, in an acid cleaning bath holding an acid solution, the acid cleaning step is carried out to dissolve and wash the surface of the polycrystalline silicon S.

The acid solution contains nitric acids as a main component, and further contains as small amount of hydrofluoric acid.

The polycrystalline silicon S is immersed in a plurality of the acid cleaning baths in a state of being retained in the basket B, and moved up and down in the acid cleaning bath in each basket B. As a result, the surface of polycrystalline silicon S is slightly dissolved, and the contaminants and oxide films are removed.

The basket B retaining the polycrystalline silicon S is composed of a synthetic resin, such as polyethylene, polypropylene, and polytetrafluoroethylene, which has corrosion resistance to the acid solution. At the bottom and side plates of the basket B, a plurality of through-holes as passages of liquid, is provided.

After retrieval from the acid cleaning bath, the polycrystalline silicon S is immersed in a bath filled with pure water, and the acid solution on the surface of the polycrystalline silicon S is washed away. Then, the polycrystalline silicon S is retrieved from the bath, and further cleaned by showered with pure water.

(Water Cleaning Step S5)

After the above-mentioned acid cleaning step, cleaning with pure water W is further carried out to remove the residual acid solution on the surface of the polycrystalline silicon.

In the water cleaning step, the polycrystalline silicon S kept in the basket B is immersed in the water cleaning bath 11 holding pure water W.

At first, pure water W in the water cleaning bath 11 is overflowed for a predetermined period (5 min) after having the polycrystalline silicon S be immersed. Because of this, mainly, fragments or the like of the basket B, which is formed by grinding with the polycrystalline silicon S, are suspended (floated) and overflow away with the pure water W. After overflowing pure water for 5 min, as a predetermined period, supply of the pure water W is stopped. Then, the polycrystalline silicon S is allowed to stand in the basket B, being kept immersed.

The extent of removal of an acid solution from a polycrystalline silicon S is evaluated by measuring the electrical conductivity C of pure water W after a certain period of time has passed after the start of the allowing the polycrystalline silicon S to stand in the pure water. The electrical conductivity C is low right after immersing the polycrystalline silicon S. The longer the time of immersion, more acid solution is eluted to the pure water W, increasing the concentration of the acid (concentration of nitric acid). Consequently, the electrical conductivity C increases. Therefore, by measuring the electrical conductivity C after at least 2 hours since the starting of the immersing of the polycrystalline silicon S, extent of removal of the acid solution from polycrystalline silicon S can be evaluated. In the present embodiment, it is regarded that the removal of acid solution is complete when the electrical conductivity C becomes 2 µS/cm or less. A specific resistance of pure water which is supplied to the water cleaning bath 11 is desirably ultrapure water of 15 MΩ·cm or more.

If the electrical conductivity C after 2 hours is higher than 2 µS/cm, the pure water W in the water cleaning bath 11 is drained out, making the water cleaning bath 11 empty. Then the water cleaning bath 11 is filled again with fresh pure water. At this time, before filling the drained water cleaning bath 11, by supplying pure water from the pure water supplying device 13 during draining pure water from the drainage device 12, the inner bottom part of the water cleaning bath 11 can be washed, flushing pure water in a depth enough to immerse the bottom portion of the platform 16. Then, the draining from the drainage device 12 is stooped, and the water cleaning bath 11 is filled with pure water.

Then, by overflowing the water cleaning bath 11 by supplying pure water, for the first predetermined period (5 min), suspended (floated) fragments or the like derived from the basket B are removed. Thus, the pure water W is cleaned. At this time, part of acid eluted to the pure water W can be removed too. Then, supplying the pure water W is stopped, and the polycrystalline silicon S is sill stood for 2 hours. After the allowing the polycrystalline silicon S to stand, the electrical conductivity C of the pure water is measured again. This sequence of operations is repeated until the electrical conductivity C becomes 2 µS/cm or lower.

The electrical conductivity C can be measured after completion of a cycle consisting of the first 5 min overflowing and subsequent 2 hours of allowing to stand. If it is predicted that the electrical conductivity C will not be 2 μS/cm or less with one or several cycles, the measurement can be skipped at the cycles, and can be performed after the completion of a predetermined number of the cycles.

(Drying Step S6)

After the water cleaning step, the surface of the polycrystalline silicon S is still wet. To remove the water, the polycrystalline silicon S is dried. One drying method is the polycrystalline silicon S is exposed to flow of clean air heated to 70° C. or higher. As an alternative method, the bucket B holding the polycrystalline silicon S can be placed inside of a vacuum container. The moisture can be removed by vacuuming the inside of the container until the inside pressure of the container becomes 1.0 Pa or lower.

(Packing and Shipping Step S7)

The polycrystalline silicon S having the moisture be removed in the drying step, is packed and shipped.

Then, as a raw material of single crystalline silicon, the polycrystalline silicon S is placed in a crucible for single crystalline silicon production, and melted.

Figure 2:
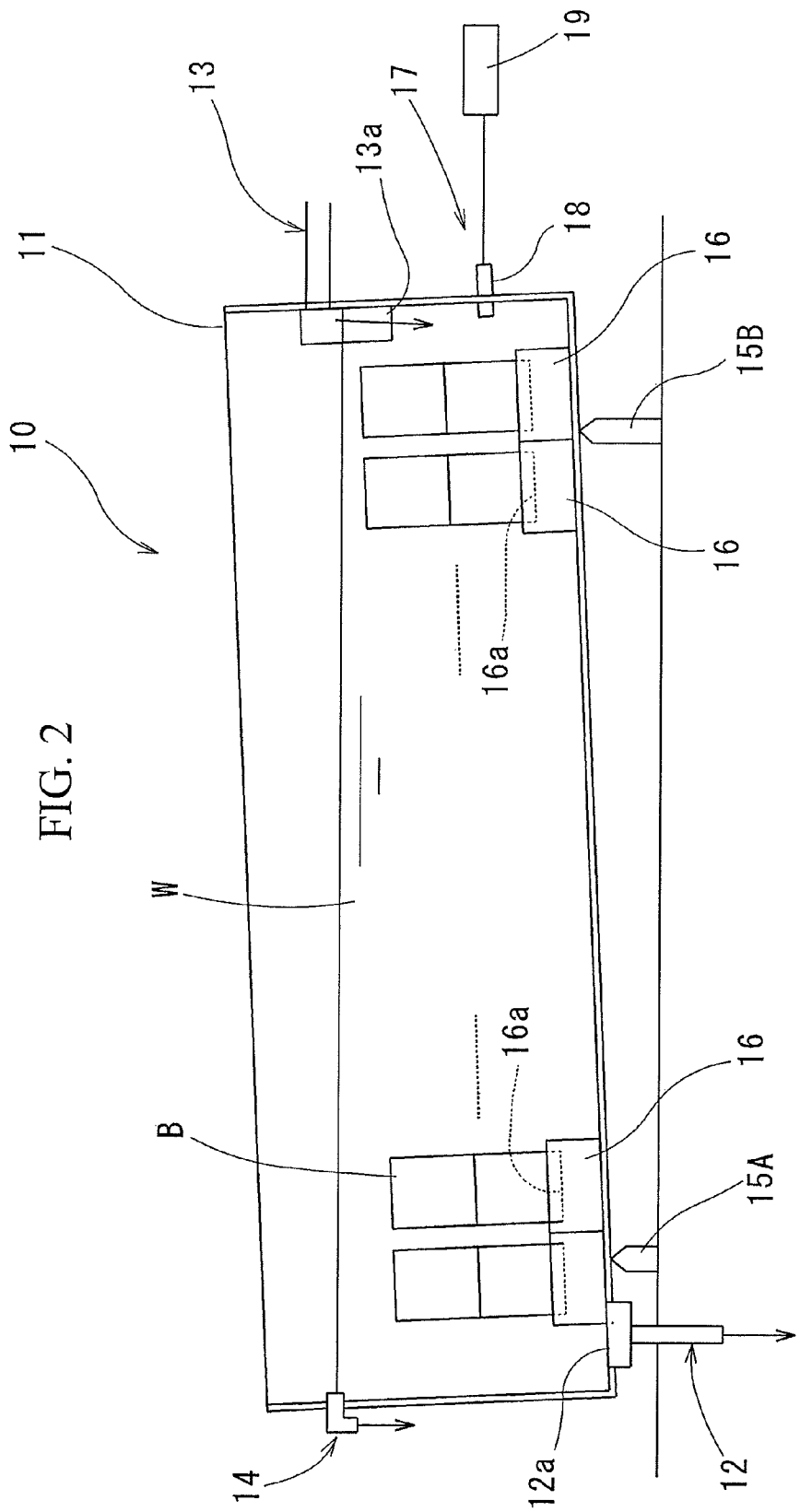
FIG. 2 is a schematic diagram showing a cross-section (longitudinal direction) of a water cleaning bath of the apparatus for washing polycrystalline silicon of an embodiment of the present invention.
Figure 3:
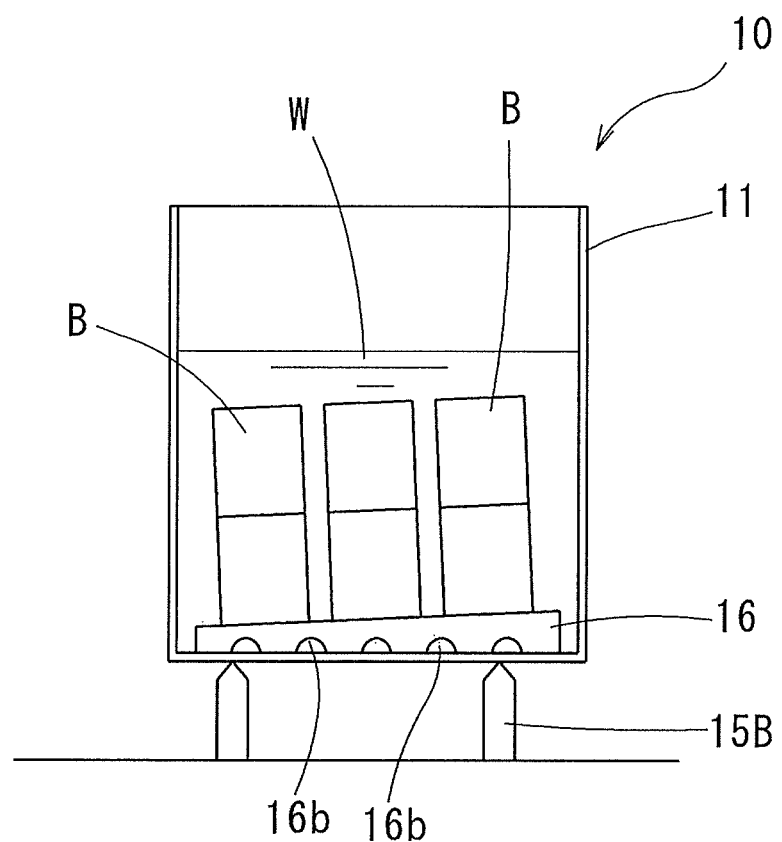
FIG. 3 is a cross-section of the water cleaning bath described in the FIG. 2, along a width direction.

Next, an apparatus 10 for washing polycrystalline silicon is explained, as an embodiment of the present invention. As shown in FIG. 2 and FIG. 3, the washing apparatus 10 includes a water cleaning bath 11 holding pure water W, a drainage device 12 that drains the pure water W held in the water cleaning bath 11 to the outside; and a pure water supply device 13 that supplies fresh pure water W to the water cleaning bath 11. In this embodiment, the drain outlet 12a of the drainage device 12 is provided on an end portion in the longitudinal direction the water cleaning bath 11, and on the bottom plate of the water cleaning bath 11. From this drain outlet 12a, the pure water is drained to the outside of the bath. The feed-water inlet 13a of the pure water supplying device 13 is provided on the opposite end portion of the water cleaning bath 11 to that with the drain outlet 12a of the drainage device 12. Also, the feed-water inlet 13a is located upper part of the water cleaning bath 11. From this drain outlet 12a, the fresh pure water W is supplied to the water cleaning bath 11. In addition, the overflow flow channel 14 is provided on the water cleaning bath 11 to discharge the overflowed pure water W from the water cleaning bath 11. The overflow flow channel 14 is located at the upper part of the end portion with the drain outlet 12a.

Under both ends of the water cleaning bath 11 in the longitudinal direction, mounts 15A and 15B are provided to support the bottom plate of the water cleaning bath 11. The mount 15A supports the bottom plate of the water cleaning bath 11 at the end portion with the drain outlet 12a, and the mount 15B, at the end portion with the feed-water inlet 13a. The mount 15B supports the bottom of the water cleaning bath 11 higher than the mount 15A. Therefore, the bottom plate of the cleaning bath 11 is sloped in the longitudinal direction, and the slope is descending from the end portion with the feed-water inlet 13a toward the end portion with the drain outlet 12a.

In addition, in the water cleaning bath 11, a plurality of platforms 16 that supports the basket B is lined up. The platform 16 has a size allowing accommodating a plurality of basket B in the width direction (in the example shown in the FIG. 3, the number is 3). A plurality of platforms 16 is fixed at the bottom plate of the water cleaning bath 11, being lined up in the longitudinal direction of the water cleaning bath 11. As shown in the FIG. 3, the supporting surface 16a of the platform 16 supporting the basket B, is sloped in the width direction of the water cleaning bath 11. Therefore, the basket B is held sloped in the longitudinal direction of the water cleaning bath 11 by the slope of the bottom plate of the water cleaning bath 11, and in the width direction of the water cleaning bath 11 by the platform 16. Through-holes 16b are provided to each platform 16, not to disturb the flow of the pure water W in the longitudinal direction of the water cleaning bath 11.

The electrical conductivity measuring device 17 is provided at the end portion with the feed-water inlet 13a. This electrical conductivity measuring device 17 includes the sensing element 18 and the water cleaning controlling portion 19, which evaluates cleanliness of the pure water based on the data fed from the sensing element 18. The sensing element 18 is fixed on the wall of the water cleaning bath 11, and the tip of the sensing element 18 protrudes toward the inside of the water cleaning bath 11.

At first, the pure water W in the water cleaning bath 11 configured as explained above, is discharged from the overflow flow channel 14 in FIG. 2, while pure water W is supplied by the pure water supplying device 13, when the polycrystalline silicon S after the step of acid cleaning is cleaned by water. After performing this overflowing of the pure water W for a predetermined period (5 min), the polycrystalline silicon S held in the basket B is allowed to stand, immersed in the water cleaning bath 11 filled with the pure water W. In an ordinary case, the pure water W in the water cleaning bath 11 is replaced after 2 hours of allowing the polycrystalline silicon S to stand and to remain immersed. In the replacement of the pure water W in the water cleaning bath 11, the pure water W is drained out through the drainage device 12. Then, the polycrystalline silicon S is immersed again in the pure water W, by supplying the pure water W to the water cleaning bath 11 through the pure water supplying device 13. Then, while keeping the polycrystalline silicon S immersed in pure water W, the water cleaning bath 11 is overflowed. The water cleaning of the polycrystalline silicon S is conducted by performing the water replacement procedure as described above, at least once.

One round of the water replacement procedure includes a step of overflowing the pure water for a predetermined period, a step of allowing the polycrystalline silicon to stand for 2 hours keeping the polycrystalline silicon immersed, a step of draining the pure water, and a step of supplying the pure water. The polycrystalline silicon S is immersed in the pure water W for 2 hours after performing the pure water overflowing. Then, by using the drainage device 12, the pure water W in the water cleaning bath 11 is drained out, emptying the inside of the water cleaning bath 11. Then again, by using the pure water supplying device 13, the amount of the pure water W corresponding to the volume of the water cleaning bath 11 is supplied freshly.

During the pure water replacement procedure, it is possible that acid (acid liquid) is remained at the bottom portion in the water cleaning bath 11. Therefore, after the first or the second draining of the pure water, the water cleaning bath 11 can be filled with the pure water, after flushing the bottom portion in the water cleaning bath 11. The flushing can be performed by supplying pure water to the water cleaning bath 11 through the pure water supplying device 13, while draining pure water from the water cleaning bath 11 through the drainage device 12. By performing the flushing, the bottom portion in the water cleaning bath 11 is washed out by the pure water, keeping the water level in the water cleaning bath 11 at a level at which the lower portion of the platform 16 is immersed. Then, after emptying the water cleaning bath 11, it is filled again with pure water.

After the allowing the polycrystalline silicon S to stand and to remain immersed in the pure water W for 2 hours, the electrical conductivity C of the pure water W in the water cleaning bath 11 is measured, by the electrical conductivity measuring device 17. If the electrical conductivity C of the pure water W is 2 μS/cm or lower, the step of water cleaning is finished.

Measurement of the electrical conductivity C can be performed in every water replacement procedure, and the water replacement procedure can be repeated until the electrical conductivity C of the pure water after 2 hours of allowing to stand, becomes 2 μS/cm or lower. In cases where a high degree of contamination is foreseen, the water replacement procedure alone can be repeated several times (for example, 5 times) every 2 hours for example, without performing the electrical conductivity measurement, and then, measure the electrical conductivity C from the next round of the replacement procedure.

As explained above, in the method of washing polycrystalline silicon of the present embodiment, the residual acid solution on the surface of the polycrystalline silicon S is removed by, immersing the polycrystalline silicon S kept in the basket B after the acid cleaning step in the pure water W in the water cleaning bath 11, overflowing the water cleaning bath 11 by the pure water W, allowing the polycrystalline silicon S to stand in the pure water W, and replacing the pure water W in the water cleaning bath 11 at least once, in the water cleaning step. Further, it is possible to figure out the extent of removal of acid and deciding an appropriate timing for finishing the water cleaning step, by measuring the electrical conductivity C of the pure water W in the water cleaning bath 11 and evaluating concentration of the acid (concentration of nitric acid). In addition, the electrical conductivity C can be measured in a short period of time, and the measurement of the electrical conductivity C gives reliable data even if the acid concentration (nitric acid concentration) is extremely low. As a result, the appropriate timing for finishing the water cleaning step can be determined easily and accurately, even in a case in which high cleanliness of the polycrystalline silicon S is required.

Figure 4:
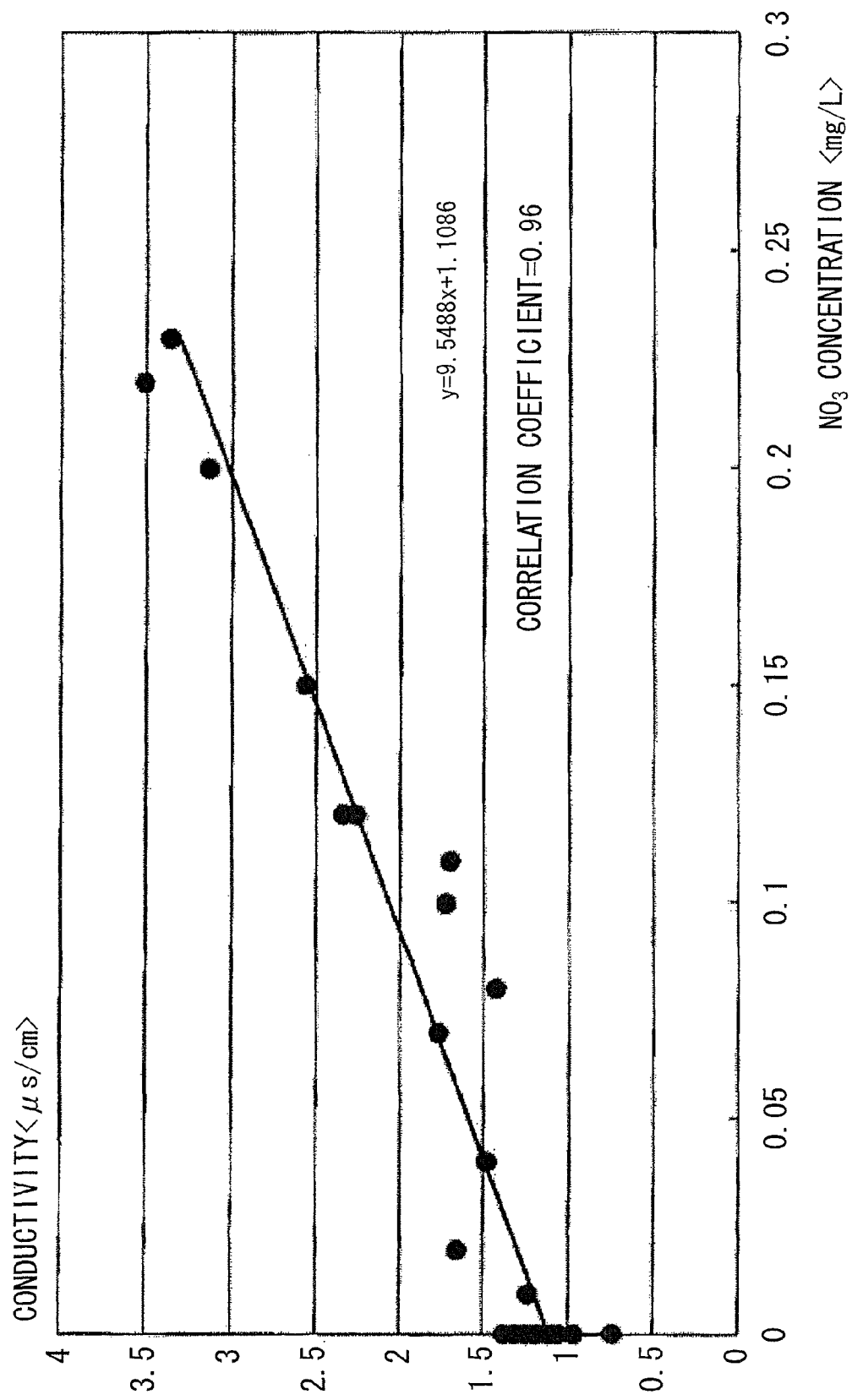
FIG. 4 is a graph showing a relationship between the electrical conductivity and the nitric acid concentration.

In the present embodiment, it is regarded that the removal of the acid solution of the polycrystalline silicon S is completed when the electrical conductivity C of pure water W becomes 2 μS/cm or less, and the water cleaning step is finished. In the condition where the electrical conductivity C is 2 μS/cm or less, the concentration of acid is very low. As a result, the water cleaning step is finished when the concentration of acid is very low. Because of this, cleanliness of polycrystalline silicon S can be reliably improved. In FIG. 4, a relationship between the electrical conductivity C and the nitric acid concentration is shown. As indicated by the FIG. 4, the concentration of nitric acid is lower than 0.1 mg/L, when the electrical conductivity C is 2 μS/cm or less. It is impossible to measure the concentration of nitric acid less than 0.1 mg/L reliably by pH measurement or ion concentration measurement. Since the extremely low concentration of nitric acid can be monitored reliably by measuring the electrical conductivity C in the present invention, timing to end the water cleaning step is properly determined, having the acid solution being removed sufficiently. As a result, it is possible to obtain the polycrystalline silicon S with high cleanliness.

In the apparatus 10 for washing polycrystalline silicon of the present embodiment, it is possible to drain the pure water W in the water cleaning bath 11 where the polycrystalline silicon S is immersed, and to supply fresh pure water W to the water cleaning bath 11, since it includes the drainage device 12 and the pure water supplying device 13. Further, with the apparatus 10, the pure water W filling the water cleaning bath 11 can be replaced at least once, and the residual acid solution on the surface of the polycrystalline silicon S can be removed efficiently. Further, extent of removal of the acid solution can be evaluated based on the electrical conductivity C, since the apparatus 10 for washing includes the electrical conductivity measuring device 17.

In addition, fragments of the basket B or impurities, which are suspended (floated) in the overflowing, can be flushed out, since the apparatus 10 for washing polycrystalline silicon of the present embodiment includes the overflow flow channel 14. The pure water W in the water cleaning bath 11 is drained out from the bottom portion of the water cleaning bath 11 through the drainage device 12. Because of this, retention of the particles of impurities, which is eluted to the pure water, inside the cleaning bath 11 can be suppressed. As a result, the cleanliness of the polycrystalline silicon S can be improved.

In the present embodiment, the acid cleaning step and the water cleaning step are carried out, having the polycrystalline silicon S held in the basket B which is composed of synthetic resin such as polyethylene, polypropylene, and polytetrafluoroethylene with corrosion resistance to acid solution. Thus polycrystalline silicon S can be washed efficiently and reliably.

Figure 5:
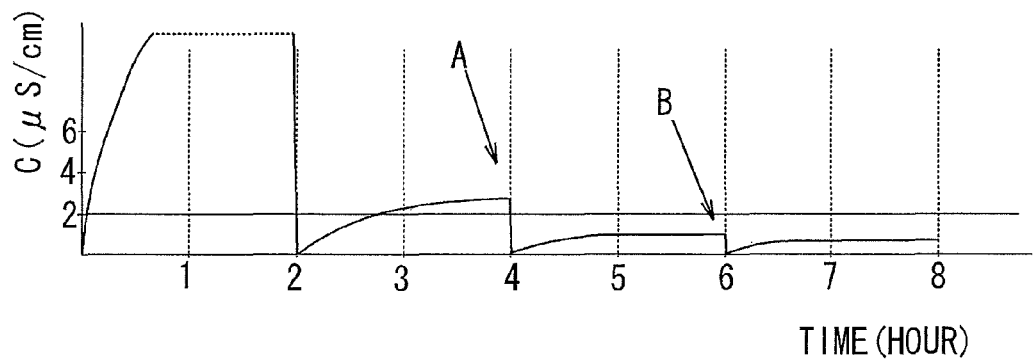
FIG. 5 is a graph showing a relationship between an electrical conductivity and immersing time in the pure water.

FIG. 5 indicates the change of the electrical conductivity C of the pure water W after the polycrystalline silicon S is immersed in the pure water W. The drastic change of the electrical conductivity C in every 2 hours is due to having the pure water replacement procedure. As shown in FIG. 5, after the first immersion of the polycrystalline silicon S in the pure water W, the electrical conductivity C increases rapidly (at the part shown by the dotted horizontal line, the electrical conductivity C is too high to be measured by the measurement equipment). Then, with each water replacement procedure, the electrical conductivity C decreases. In this FIG. 5, the electrical conductivity C is reduced to 2 μS/cm or less, after the second water replacement procedure. As shown by the symbol A, depending on the extent of acid elution from the surface of the silicon, it is possible to have an electrical conductivity C equal to 2 μS/cm or less just after the water replacement, but to have an electrical conductivity C higher than 2 μS/cm after 2 hours of allowing to stand. Therefore, the pure water W replacement procedure is repeated until the electrical conductivity C, after the overflowing and the 2 hours of allowing to stand, turns to 2 μS/cm or less, as shown by the symbol B.

In this embodiment, since the sensing element 18 of the electrical conductivity measuring device 17 is provided under the feed-water inlet 13a, the electrical conductivity C can be measured accurately. As shown in FIG. 5, the electrical conductivity C of the pure water introduced at first is extremely high. This is because, there is a very high concentration of nitric acid, which is eluted from the polycrystalline silicon S, in the pure water W. By draining the pure water containing a high concentration of nitric acid, and supplying fresh pure water W, the electrical conductivity C can be reduced. However, it is possible that a certain amount of nitric acid is attached on the wall of the bath adjacent to the drain outlet 12a. In that case, if the sensing element 18 is provided on a wall adjacent to the drain outlet 12a, nitric acid attaches to the sensing element 18, and accuracy of the measurement with the tainted sensing element 18 is deteriorated. On the other hand, the vicinity of the feed-water inlet 13a, is the location where the fresh pure water is supplied. Therefore, less nitric acid is attached on the wall. Accordingly, by providing the sensing element 18 adjacent to the feed-water inlet 13a, there is less interference for measurement of the electrical conductivity C, and the electrical conductivity C can be measured accurately. In addition, slopes on the bottom plate of the water cleaning bath 11 and the supporting surface 16a of the platform 16, contribute to the reduction of residual nitric acid at locations adjacent to the feed-water inlet 13a.

Examples

According to the method of washing described above, polycrystalline silicon was washed multiples times, with varying washing conditions. Table 1 shows the final electrical conductivity of the pure water in the water cleaning bath, and amount of impurity resided on the surface of the polycrystalline silicon after the washing in each condition.

In each condition, a plurality of one kind (classification) of polycrystalline silicon is immersed in one water cleaning bath. In Table 1, "CHUNK (LARGE)" means a large lump of polycrystalline silicon, which has a diameter of about 50 to 100 mm. In Table 1, "CHUNK (SMALL)" means a small lump of polycrystalline silicon, which has a diameter of about 5 to 50 mm. A plurality of baskets holding 5 kg of lump of polycrystalline silicon was prepared. Then, the baskets were immersed in one water cleaning bath to satisfy the weight specified in each condition. For the impurity analysis, ICP-MS (Inductively Coupled Plasma-Mass Spectrometry) was used. Since the amount of the impurity was extremely low, only the lower limits of the analysis were shown.

In addition, even though lumps of polycrystalline silicon were subjected to washing in the embodiments, the form of polycrystalline silicon is not limited thereto. That is, for example, a columnar polycrystalline silicon ingot may be subjected to washing. In this case, the polycrystalline silicon may be used as a raw material for a solar cell, in addition to a raw material for single crystalline silicon.

INDUSTRIAL APPLICABILITY

The present invention relates to a method of washing polycrystalline silicon including a step of acid cleaning in which the polycrystalline silicon is cleaned by an acid solution, and the step of water cleaning in which the polycrystalline silicon is cleaned by pure water after the step of acid cleaning. In the step of water cleaning, residual acid solution on the surface of the polycrystalline silicon is removed, by immersing the polycrystalline silicon in a water cleaning bath holding pure water, and replacing pure water in the water cleaning bath with fresh pure water at least once. The step of water cleaning is finished when the electrical conductivity C becomes 2 $\mu$S/cm or lower, after at least 2 hours, since replacing the pure water and allowing the polycrystalline silicon to stand and

TABLE 1

| CONDITION | CLASSIFICATION | WEIGHT OF POLYCRYSTALLINE SILICON IMMERSED Kg/BATH | CONDUCTIVITY $\mu$S/cm | METAL IMPURITIES ON SURFACE | | | | | |
|---|---|---|---|---|---|---|---|---|---|
| | | | | Fe | Cr | Ni | Cu | Na | Zn |
| 1 | CHUNK (LARGE) | 680 | 0.68 | <0.05 | <0.01 | <0.01 | <0.01 | <0.02 | <0.02 |
| 2 | CHUNK (SMALL) | 680 | 0.7 | <0.05 | <0.01 | <0.01 | <0.01 | <0.02 | <0.02 |
| 3 | CHUNK (SMALL) | 720 | 0.68 | <0.05 | <0.01 | <0.01 | <0.01 | <0.02 | <0.02 |
| 4 | CHUNK (LARGE) | 670 | 0.72 | <0.05 | <0.01 | <0.01 | <0.01 | <0.02 | <0.02 |
| 5 | CHUNK (SMALL) | 680 | 0.68 | <0.05 | <0.01 | <0.01 | <0.01 | <0.02 | <0.02 |
| 6 | CHUNK (SMALL) | 690 | 0.7 | <0.05 | <0.01 | <0.01 | <0.01 | <0.02 | <0.02 |
| 7 | CHUNK (SMALL) | 530 | 0.66 | <0.05 | <0.01 | <0.01 | <0.01 | <0.02 | <0.02 |
| 8 | CHUNK (LARGE) | 710 | 1.08 | <0.05 | <0.01 | <0.01 | <0.01 | <0.02 | <0.02 |

As shown in Table 1, by washing polycrystalline silicon until the electrical conductivity of the pure water became 2 $\mu$S/cm or less, after the water cleaning, amount of the residual acid and impurity on the surface of the polycrystalline silicon was reduced significantly. As a result, the polycrystalline silicon with high cleanliness was obtained.

As above, embodiments of the present invention are illustrated, but the invention is not limited thereto, and can be suitably changed without departing from the technical concept of the invention.

For example, the water cleaning step is complete when the electrical conductivity C is 2 $\mu$S/cm or less, but it is not limited to this. That is, the present invention is preferable to appropriately set the electrical conductivity depending on the desired cleanliness for polycrystalline silicon. However, if the electrical conductivity C is set to 2 $\mu$S/cm or less, the nitric acid concentration becomes less than 0.1 mg/L. As a result, an acid solution can be reliably removed to the extent assuring high cleanliness of the polycrystalline silicon.

With regard to the apparatus for washing polycrystalline silicon of the present embodiment, a configuration that allows draining of pure water from the bottom portion of the water cleaning bath through the drainage device is explained. However, the apparatus of the present invention is not limited to this configuration. It is only required that the apparatus be capable of draining pure water from the inside of the water cleaning bath to the outside.

remain immersed. According to the present invention, extent of removal of acid solution can be evaluated easily and accurately.

BRIEF DESCRIPTION OF THE REFERENCE SYMBOLS

10: Apparatus for washing polycrystalline silicon
11: Water cleaning bath
12: Water drainage device
12a: Drain outlet
13: Pure water supplying device
13a: Feed-water inlet
14: Overflow flow channel
15A, 15B: Mount
16: Platform
16a: Supporting surface
16b: Through-hole
17: Electrical conductivity measuring device
18: Sensing element
19: Water cleaning controlling portion
20: Reactor
21: Seed rod
22: Material gas supplying tube
23: Gas exhausting tube

What is claimed is:

1. A method of washing polycrystalline silicon lumps produced by the Siemens method comprising:

a step of acid cleaning in which the polycrystalline silicon lumps retained in a basket are cleaned with an acid solution in an acid clean bath;

a step of transferring the basket retaining the acid cleaned polycrystalline silicon lumps to a supporting surface of a platform provided directly on the bottom plate of a water cleaning bath filled with pure water, a cross section of the supporting surface taken along the longitudinal direction of the water cleaning bath being parallel to the cross section of the bottom plate also taken along the longitudinal direction of the water cleaning bath and higher than the bottom plate of the water cleaning bath in a vertical direction;

a step of overflowing pure water by supplying pure water to the cleaning bath after the step of transferring;

a step of immersing the polycrystalline silicon lumps in the pure water after the step of overflowing in the water cleaning bath for at least 2 hours to remove residual of the acid solution on surfaces of the polycrystalline silicon lumps, the pure water cleaning tank provided with a pure water supply device, which is positioned to one end of the water cleaning bath in a longitudinal direction of the water cleaning bath and a pure water drainage device, which is positioned to the other end of the water cleaning bath in the longitudinal direction and to the bottom plate of the water cleaning bath;

a step of measuring an electrical conductivity C of the pure water by an electrical conductivity measuring device provided in a vicinity of a feed-water inlet of the pure water supply device after the step of immersing;

a step of repeating the step of immersing after replacing the pure water in the water cleaning bath with fresh pure water when the electrical conductivity is more than 2 µS/cm in the step of measuring;

a step of ending the step of immersing in a case where the electrical conductivity C measured in the step of measuring is 2 µS/cm or lower, wherein, the bottom plate of the water cleaning bath is sloped down toward the water drainage device in the longitudinal direction the water cleaning bath with respect to the bottom plate, the supporting surface of the platform is sloped in a width direction of the water cleaning bath, a plurality of through-holes are provided between the lower end surface of the platform and the bottom surface of the water cleaning bath in the longitudinal direction of the water cleaning bath.

2. An apparatus for washing polycrystalline silicon lumps produced by the Siemens method comprising:

an acid clean bath holding an acid solution and configured to retain a basket retaining polycrystalline silicon lumps;

a water cleaning bath for immersing the polycrystalline silicon in pure water after a step of acid cleaning with the acid solution;

a platform provided directly on a bottom plate of the water cleaning bath, the platform having a supporting surface, a cross section of the supporting surface taken along the longitudinal direction of the water cleaning bath is parallel to the cross section of the bottom plate also taken along the longitudinal direction of the water cleaning bath and higher than the bottom plate of the water cleaning bath in a vertical direction;

a pure water supplying device that supplies fresh pure water to the water cleaning bath positioned to one end of the water cleaning bath in the longitudinal direction of the water cleaning bath;

a water drainage device that drains the pure water in the water cleaning bath positioned to the other end of the of the water cleaning bath in the longitudinal direction and to the bottom plate of the water cleaning bath;

an electrical conductivity measuring device that is provided in a vicinity of a feed-water inlet of the pure water supply device and configured to measure an electrical conductivity of the pure water held in the water cleaning bath; and an overflow flow channel that is provided to an upper end part of the water cleaning bath on a side with the water drainage device in a longitudinal direction, wherein, a sensing element of the electrical conductivity measuring device is placed in a vicinity of a feed-water inlet of the pure water supplying device provided at a location distant from a drain outlet of the water drainage device, the bottom plate of the water cleaning bath is sloped down toward the water drainage device in a longitudinal direction the water cleaning bath, the supporting surface of the platform is sloped in a width direction of the water cleaning bath with respect to the bottom plate, and a plurality of through-holes are provided to the platform in the longitudinal direction of the water cleaning bath.

* * * * *